(12) United States Patent
Gates

(10) Patent No.: US 7,080,989 B2
(45) Date of Patent: Jul. 25, 2006

(54) MEMORY METAL SPRINGS FOR HEATSINK ATTACHMENTS

(75) Inventor: William George Gates, Milton Keynes (GB)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/865,296

(22) Filed: Jun. 10, 2004

(65) Prior Publication Data

US 2005/0277324 A1    Dec. 15, 2005

(51) Int. Cl.
*H01R 12/00* (2006.01)

(52) U.S. Cl. .................... 439/73; 439/161; 439/487; 361/704; 361/710; 361/719; 257/719

(58) Field of Classification Search ............. 439/487, 439/161, 73, 74, 66
See application file for complete search history.

(56) References Cited

U.S. PATENT DOCUMENTS

| | | | |
|---|---|---|---|
| 4,046,442 A * | 9/1977 | Hutchison | 439/72 |
| 5,010,949 A | 4/1991 | Dehaine | |
| 5,121,727 A | 6/1992 | Kramer et al. | |
| 5,167,511 A * | 12/1992 | Krajewski et al. | 439/61 |
| 5,273,441 A * | 12/1993 | Volz et al. | 439/72 |
| 6,126,371 A | 10/2000 | McCloskey | |
| 6,333,772 B1 | 12/2001 | Mori et al. | |
| 6,490,161 B1 * | 12/2002 | Johnson | 361/704 |
| 6,496,369 B1 | 12/2002 | Nakamura | |
| 6,608,752 B1 | 8/2003 | Morris et al. | |
| 6,733,324 B1 | 5/2004 | Lecsek et al. | |
| 2004/0074630 A1 | 4/2004 | Sen et al. | |

OTHER PUBLICATIONS

Notification of Transmittal of the International Search Report, Application No. PCT/US2005/019967 mailed Sep. 28, 2005.
Written Opinion of the International Searching Authority, Application No. PCT/US2005/019967 mailed Sep. 28, 2005.

* cited by examiner

*Primary Examiner*—P. Austin Bradley
*Assistant Examiner*—X. Chung-Trans
(74) *Attorney, Agent, or Firm*—Meyertons Hood Kivlin Kowert & Goetzel, P.C.; B. Noël Kivlin (57) ABSTRACT

An assembly for a computer system is mountable on a circuit board of a computer system. The assembly includes a base portion for engaging with an electronic component mounted on the circuit board. The assembly also includes a spring formed of memory metal. The spring is operable to urge the base portion against the electronic component to urge the electronic component towards the circuit board. The spring is configured to provide a greater spring force for urging the base portion against the electronic component when the spring is above a predetermined temperature than when it is below said predetermined temperature.

35 Claims, 5 Drawing Sheets

MEMORY METAL SPRINGS FOR HEATSINK ATTACHMENTS

BACKGROUND OF THE INVENTION

The present invention relates to the mounting of electronic components on circuit boards and for providing cooling for those electronic components.

In computer systems, it is known to mount electronic components such as microprocessors on a circuit board using ball grid arrays (BGA). In such arrangements, the electronic component is provided with a series of contact balls on an underside thereof. The contact balls engage with a series of corresponding springs in a socket, which is mounted on a circuit board, thereby to form electrical connections for the electronic component. To ensure that the electrical connections are stable, a force can be exerted on the electronic component to urge the electronic component towards the circuit board, thereby ensuring physical contact between the contact balls of the electronic component and the springs of the socket.

The amount of force with which it is desirable to urge the electronic component towards the circuit board for ensuring sufficient stability of the electrical connections can, in some applications, be relatively large. In some applications, a member is provided with a number of screw attachments for screwing into the circuit board. To urge the electronic component towards the circuit board, the screw attachments of the member are tightened and the member engages with the electronic component to provide the necessary force. As the forces involved can be relatively large this can lead to damage to the electronic component and/or the circuit board. Also, using a simple screw attachment mechanism as described above has the disadvantage that it is difficult to judge the forces which are actually being applied to the electronic component. Additionally, the sequential tightening of a plurality of screws can lead to uneven forces being applied to the electronic component during mounting. These factors can lead to damage of the electronic component.

Where the electronic component requires cooling a heatsink may be provided. An example of such a component would be a microprocessor. It is known to provide a heatsink for a microprocessor, which engages with a surface of the microprocessor for forming a thermal contact therewith. To ensure that a good thermal contact is made, the heatsink can be provided with a mechanism for urging the heatsink against the microprocessor. Again the necessary forces can be somewhat large and difficult to judge when mounting the heatsink on the microprocessor/circuit board.

The present invention aims to solve at least some of the problems outlined above.

SUMMARY OF THE INVENTION

Aspects of the invention are defined in the accompanying claims and independent claims.

According to an aspect of the invention there is provided an assembly for a computer system. The assembly is mountable on a circuit board of the computer system. The assembly includes a base portion for engaging with an electronic component mounted on the circuit board. The assembly also includes a spring formed of memory metal. The spring is operable to urge the base portion against the electronic component to urge the electronic component towards the circuit board. The spring is configured to provide a greater spring force for urging the base portion against the electronic component when the spring is above a predetermined temperature than when it is below the predetermined temperature.

The assembly can include one or more formations for emitting heat. The formations for emitting heat can be integrally formed with the base portion. More than one spring can be provided. The spring/s may be a coil spring.

The predetermined temperature can be selected according to a number of criteria. For example, the predetermined temperature can a temperature lower than an operating temperature of the computer system. If the predetermined temperature is higher than room temperature, this can ensure that the memory metal of the springs passes through the predetermined temperature when the computer system is switched on. The predetermined temperature can be chosen as a temperature in range 0–25 degrees Centigrade inclusive. For example, the predetermined temperature could be one of the following temperatures: 0, 1, 2, 3, 4, 5, 6, 7, 8, 9, 10, 11, 12, 13, 14, 15, 16, 17, 18, 19, 20, 21, 22, 23, 24, 25 degrees Centigrade.

The assembly can include a heating element for heating the spring above the predetermined temperature. The assembly can include a circuit for passing a current through the spring for heating the spring above the predetermined temperature.

The memory metal can be a nickel titanium alloy.

According to another aspect of the invention there is provided a circuit board having an electronic component mounted thereon and an assembly. The assembly includes a base portion for engaging with the electronic component. The assembly also includes a spring formed of memory metal. The spring is operable to urge the base portion against the electronic component to urge the electronic component towards the circuit board. The spring is configured to provide a greater spring force for urging the base portion against the electronic component when the spring is above a predetermined temperature than when it below the predetermined temperature.

According to a further aspect of the invention there is provided computer system comprising a circuit board having an electronic component mounted thereon, and an assembly. The assembly includes a base portion for engaging with the electronic component. The assembly also includes a spring formed of memory metal. The spring is operable to urge the base portion against the electronic component to urge the electronic component towards the circuit board. The spring is configured to provide a greater spring force for urging the base portion against the electronic component when the spring is above a predetermined temperature than when it below the predetermined temperature.

According to another aspect of the invention there is provided a method. The method includes providing an assembly. The assembly includes a base portion for engaging with an electronic component mounted on a circuit board of a computer system. The assembly also includes a spring formed of memory metal. The spring is operable to urge the base portion against the electronic component to urge the electronic component towards the circuit board. The spring is configured to provide a greater spring force for urging the base portion against the electronic component when the spring is above a predetermined temperature than when it below the predetermined temperature. The method also includes mounting the assembly on the circuit board.

The spring can be cooled (using, for example, an aerosol spray) to a temperature below the predetermined temperature prior to mounting the assembly on the circuit board.

A heating element can be used to heat the spring to a temperature above the predetermined temperature. A current can be passed through the spring to heat the spring to a temperature above the predetermined temperature.

BRIEF DESCRIPTION OF THE DRAWINGS

Embodiments of the present invention will be described hereinafter, by way of example only, with reference to the accompanying drawings in which like reference signs relate to like elements and in which.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the accompanying claims.

DESCRIPTION OF PARTICULAR EMBODIMENTS

Embodiments and examples are described hereafter by way of example only in the following with reference to the accompanying drawings.

Figure 1:
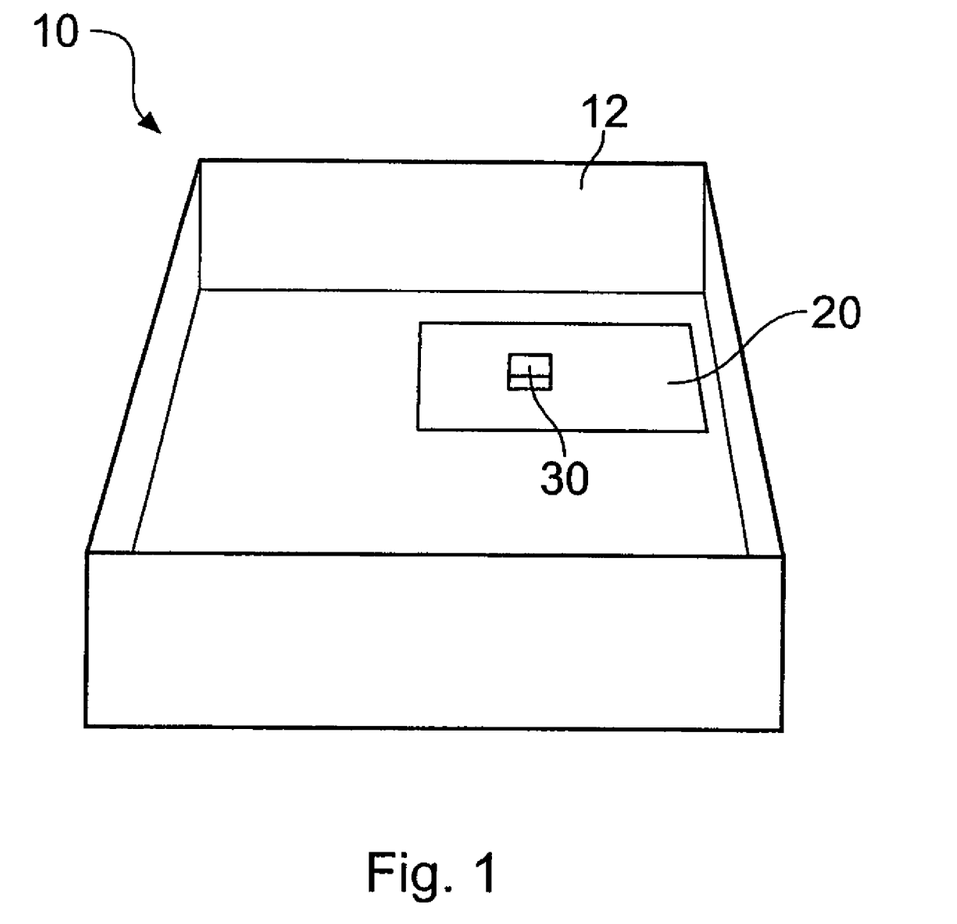
FIG. 1 illustrates an example of a computer system.

FIG. 1 illustrates an example of a computer system 10. The computer system 10 includes a housing 12. Within the housing 12 there is a circuit board 20 on which a number of electronic components can be mounted. Also mounted on the circuit board is an assembly 30. The assembly 30 can act to ensure that a component mounted on the circuit board 20 is securely mounted on the circuit board 20, and that any electrical connections between the component and the circuit board 20 are maintained. In some examples, the assembly 30 can also act as a heatsink, to provide cooling for the electronic component.

Figure 2:
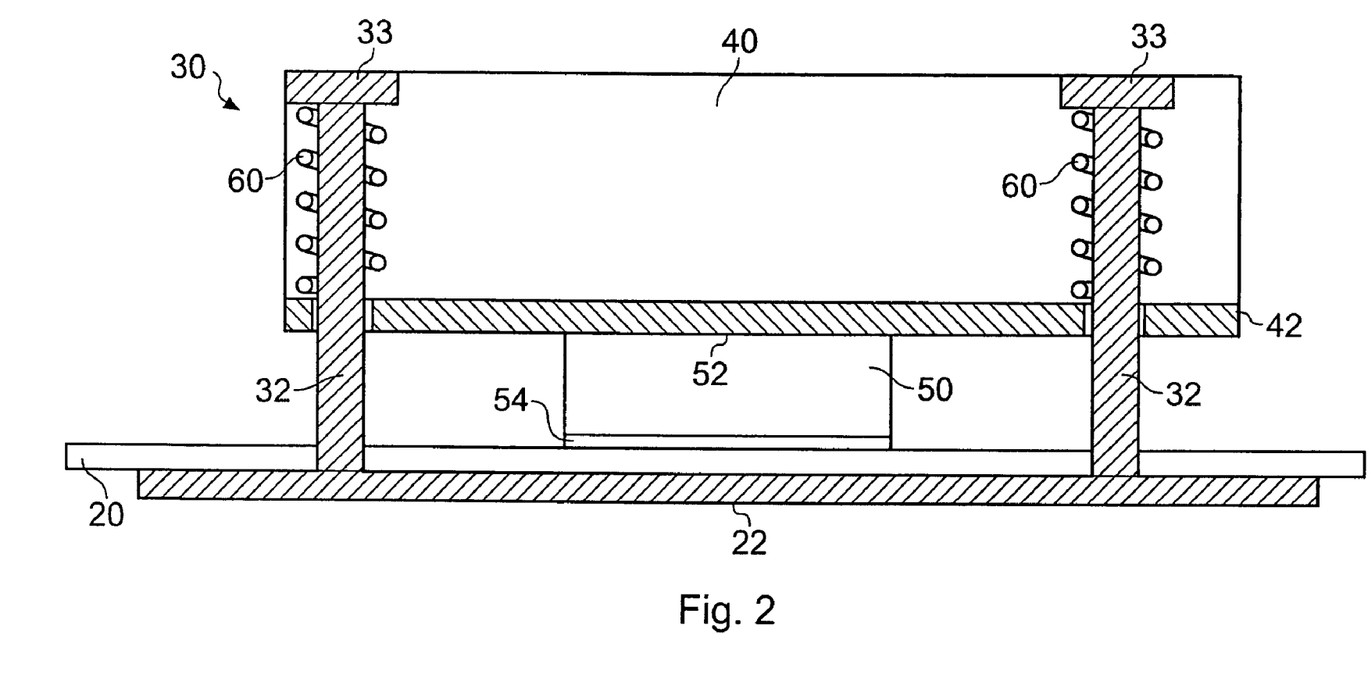
FIG. 2 illustrates a first example of an electronic component and an assembly mounted on a circuit board.

FIG. 2 illustrates an example of an assembly 30, which is mounted on a circuit board 20. The assembly 30 can be used to facilitate secure mounting of an electronic component 50 such as a microprocessor, on the circuit board 20.

The electronic component 50 in this example is mounted in a socket 54, which is itself mounted on the circuit board 20. Alternatively the electronic component 50 can be mounted directly on the circuit board 20. Electrical connections between the electronic component 50 and the socket 54/circuit board 20 can be formed with, for example, a ball grid array (BGA). Other types of electronic connection could be provided however (for example, a series of pin connections).

The assembly includes a base portion 42, which engages with a top surface of the electronic component 50. The assembly also includes two struts 32, which are attached through apertures in the circuit board 20 to a plate 22, which is located on the side of the circuit board 20 opposite to the side on which the electronic component 50 is mounted. In other examples, the plate 22 may be omitted and the struts 32 may be mounted directly on the circuit board 20. The struts may comprise screws.

Figure 3:
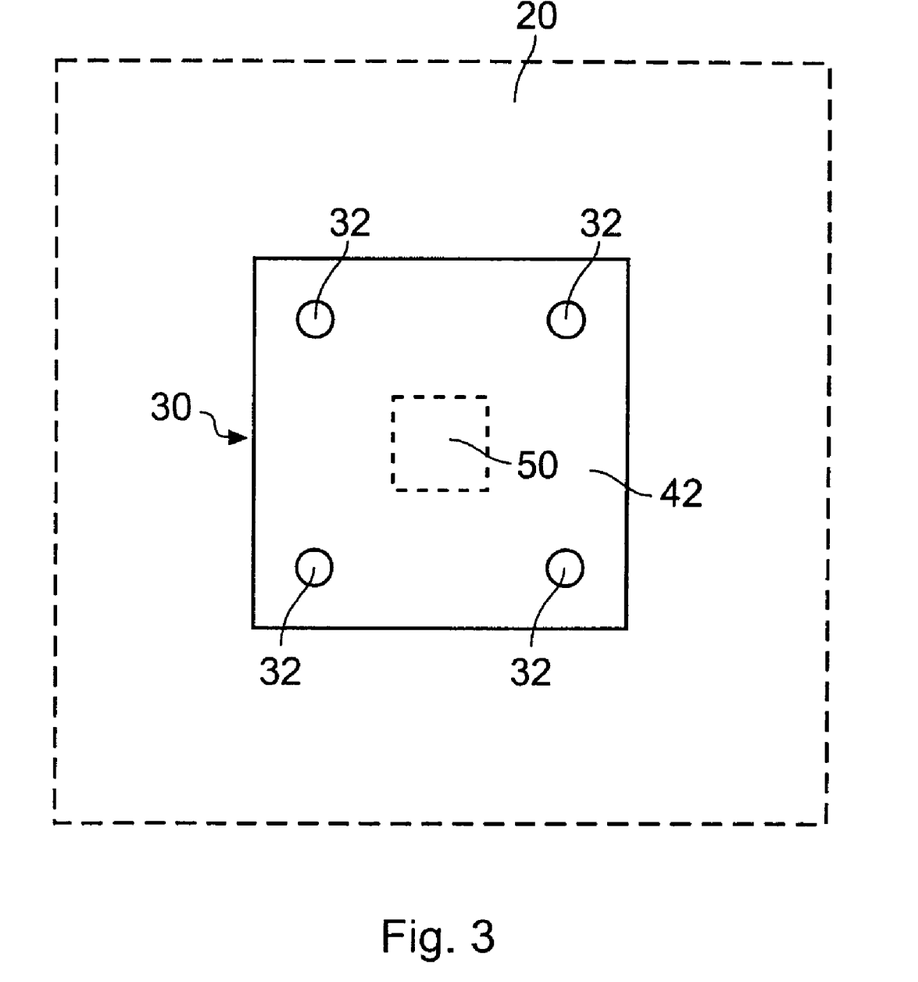
FIG. 3 shows another view of the electronic component and assembly shown in FIG. 2, from above the circuit board.

FIG. 3 shows a top view of the circuit board 20 with the assembly 30 and electronic component 50 mounted thereon. The circuit board in FIG. 3 is shown generally by the dashed line—it will be appreciated that the circuit board 20 may extend further than is shown in the figures. As can be seen in FIG. 3, the assembly 30 includes four struts 32. In other examples, some of these struts may be omitted or further struts may be included. Each strut can pass through a respective aperture, which is provided in the base portion. The distribution of the struts 32 with respect to the base portion can take any suitable form—in the present example, a square formation is used. The position of the electronic component 50 with respect to the base portion 42 and the struts in this example is shown in FIG. 3 by a dashed line.

Referring once more to FIG. 2, the assembly 30 also includes a number of springs 60, each of which is located around a respective one of the struts 32. Each spring 60 engages with a top portion 33 of its respective strut 32. Where the struts 32 comprise screws, the top portion 33 may be a head of each screw. Each spring 60 also engages with an upper surface of the base portion 42. Each spring 60 is in a compressed state, sandwiched between the top portion 33 and the base portion 32 and is thereby operable to urge against the base portion 42 to urge the base portion 42 against the top surface of the electronic component 50.

In some examples, the assembly can be provided with one or more formations for emitting heat. For example, these formations may be formed integrally with the base portion 42 and thereby be in thermal contact therewith. A fan can also bee provided, to supply a flow of cooling air over the formations. The fan may be included in the assembly 30 or can alternatively be provided separately. Since the base portion 42 engages with the upper surface of the electronic component 50 and is in thermal contact therewith, heat produced by the electronic component 50 can be passed from the electronic component 50 to the base portion 42 and then on to be emitted from the aforementioned formations. Cooling for the electronic component 50 can thereby be provided. The action of the springs 60 to urge the base portion 42 against the electronic component 50 can improve the thermal contact between the base portion 42 and the electronic component 50 thereby providing enhanced cooling. Additionally, in some examples, a layer of thermally conductive material such as thermally conductive grease can be provided at the interface between the base portion 42 and the electronic component in the area generally shown in FIG. 2 by the reference numeral 52. This can further improve the thermal contact between the base portion 42 and the electronic component 50.

The action of the springs 60 to urge the base portion 42 against the electronic component 50 has the effect of urging the electronic component 50 towards the circuit board 20. Whether the electronic component 50 is mounted directly on the circuit board 20 or is mounted in a socket 54, for example as is shown in FIG. 2, this has the effect of holding the electronic component 50 in place and ensuring that any electrical connections between the electronic component 50 and the socket 54/circuit board 20 are maintained.

Different configurations of spring 60 may be provided. In the examples shown in FIGS. 2, 4 and 5, the springs 60 are configured as coil springs. However, other configurations of spring could be used, for example, a leaf spring.

The springs described herein are formed of memory metal. One example of a suitable memory metal is nitinol, which is an alloy of nickel and titanium. Memory metals of this kind have the property that they undergo a solid-solid phase transition at a temperature $T_c$, at which a reversible expansion/contraction of the metal occurs. The expansion/contraction can be abrupt, and occur substantially as the temperature $T_c$, as opposed to a gradual expansion/contraction in a temperature region centred in $T_c$.

In FIG. 2, to mount the electronic component 50 and assembly 30 on the circuit board 20, the electronic component 50 can first be mounted in the socket 54 (or directly on the circuit board 20) and then the struts 32 can attached to the plate 22 through the apertures in the circuit board 20. The transition temperature $T_c$ associated with the memory metal which forms the springs 60 can be chosen such that at room temperature, the springs 60 are in a retracted state corresponding to the memory metal being at a temperature below $T_c$. The transition temperature $T_c$ can further be chosen such that it is lower than an operating temperature of the computing system. Accordingly, once the electronic component 50 and assembly 30 has been mounted and the computer system has been switched on, heat produced by the electronic component 50 and by other components within the computer system can cause the memory metal of the springs 60 to undergo a phase transition in which they expand to an extended state.

In the retracted state, the amount of force with which the springs 60 are operable to urge the base portion 42 against the electronic component 50 is lower than the amount of force which is provided when the memory metal of the springs 60 is in its extended state. Accordingly, mounting of the assembly 30 over the electronic component 50 is made easier since no great force can be applied by the base portion 42 against the electronic component 50 below the transition temperature $T_c$. In particular, if an uneven force is applied during mounting, the uneven force will be lower than would be applied were the springs 60 to be in their extended state. Also, no large shearing force can result from the tightening of and of the struts 32 (for example, where the struts 32 comprise screws). This can prevent damage to the electronic component 50 and in particular to any electrical connections thereof while the assembly 30 is being mounted.

Conversely, once the assembly 30 is mounted and the computer system is in operation the springs 60 provide a greater force for urging the base portion 42 against the electronic component 50 for urging the electronic component 50 against the circuit board 20 to maintain the electrical connections thereof and also to improve the thermal contact between the base portion 42 and the electronic component 50 as described above.

The memory metal, which is used to form the springs 60, can be chosen so as to select a particular temperature value ($T_c$) at which the springs transform form a retracted to an extended state. For example, a memory metal with a $T_c$ of lower than 10, 12, 14, 16, 18, 20, 22, 24 or 26 degrees Centigrade can be selected.

In some systems, the value of $T_c$ can be chosen to be below an anticipated room temperature. To mount the assembly, the springs 60 can first be cooled to below room temperature and below $T_c$, using, for example, an aerosol spray. The assembly 30 can then be mounted on a circuit board 20 before the springs 60 warm up and pass back through $T_c$. Once the assembly 30 is mounted, the temperature of the memory metal will eventually rise above $T_c$ and the springs 60 will enter their extended state, thereby urging the electronic component 50 against the circuit board 20 with a larger degree of force.

In some systems, the heat produced by the electronic component 50 and by other components of the system may be insufficient for producing an ambient temperature which is higher than the transition temperature $T_c$ of a given memory metal. Examples of how additional heat can be provided for pushing the memory metal of the springs 60 through the transition temperature $T_c$ are now described with referenced to FIGS. 4 and 5.

Figure 4:
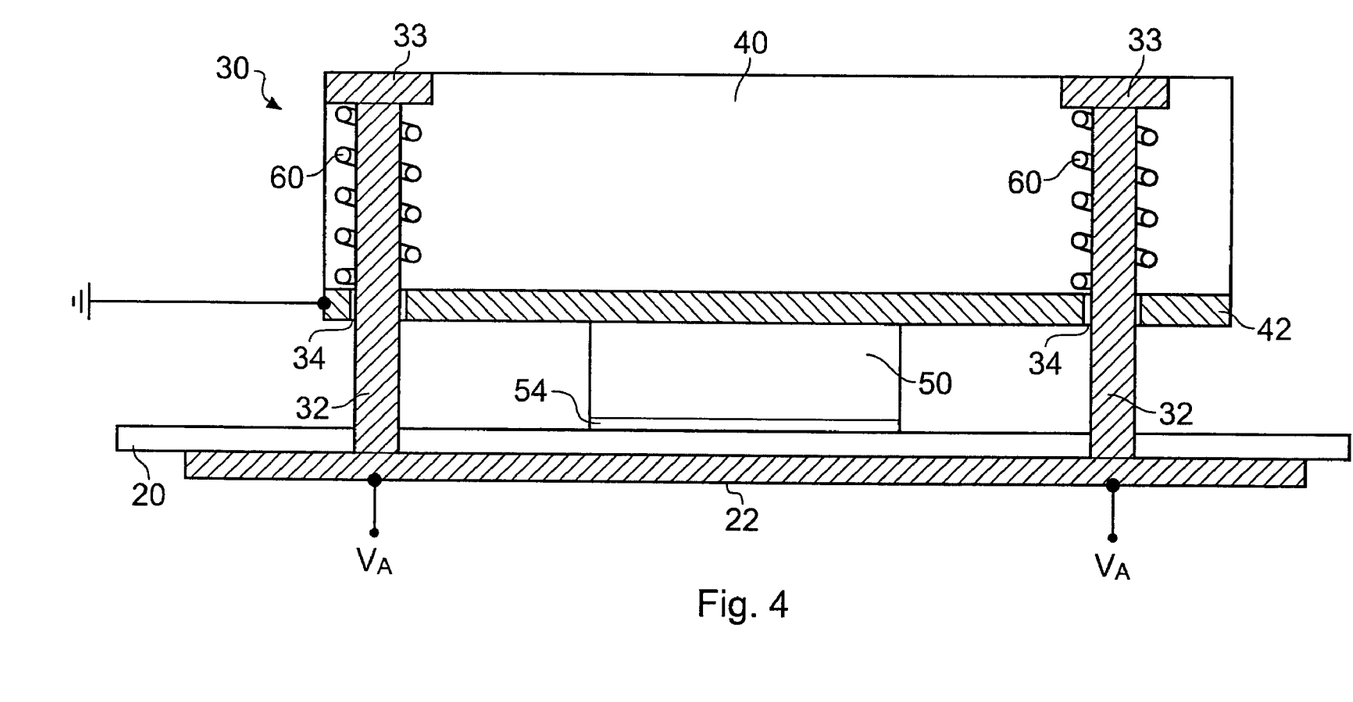
FIG. 4 illustrates another example of an electronic component and an assembly mounted on a circuit board.

FIG. 4 shows another example of an assembly 30 mounted on a circuit board 20. The assembly includes a number of struts 32, a base portion 42 and a number of springs 60 as described above. In this example, the springs 60 are formed of a memory metal which has a transition temperature $T_c$ which is higher than an operating temperature of the computer system in which the circuit board 20, electronic component 50 and assembly 30 are included. The struts 32 in this example are electrically conductive. The base portion can also be electrically conductive or can be provided with an electrically conductive surface layer. An insulating region 34 is provided within the apertures in the base portion 42, to electrically isolate the base portion 42 from the struts 32.

To provide heating of the memory metal in the springs 60, an electrical current can be passed through each spring 60. This produces Joule heating of the memory metal. The magnitude of the current can be chosen to raise the temperature of the memory metal above its transition temperature $T_c$, thereby causing expansion of the springs 60. In this example, the base portion 42 is held at a first voltage (for example a ground voltage) as is illustrated schematically in FIG. 4. A different voltage $V_A$ can be applied to each of the struts 32. The potential difference between the base portion 42 and the struts 32 causes a current to flow through the struts 32 and into the springs 60. The springs 60 are in electrical communication with the base portion (or an electrically conductive surface layer thereof) and the current flows from the springs 60 into the base portion 42. To ensure that current flows through substantially all of each spring 60, the struts 32 can have an outer surface which is coated with an electrically isolating material. This layer of isolating material can be omitted from the top portions 33 however, thereby to allow current to pass up through the struts 32 into the top portion 33 and from there down through each spring 60 to the base portion 42.

Figure 5:
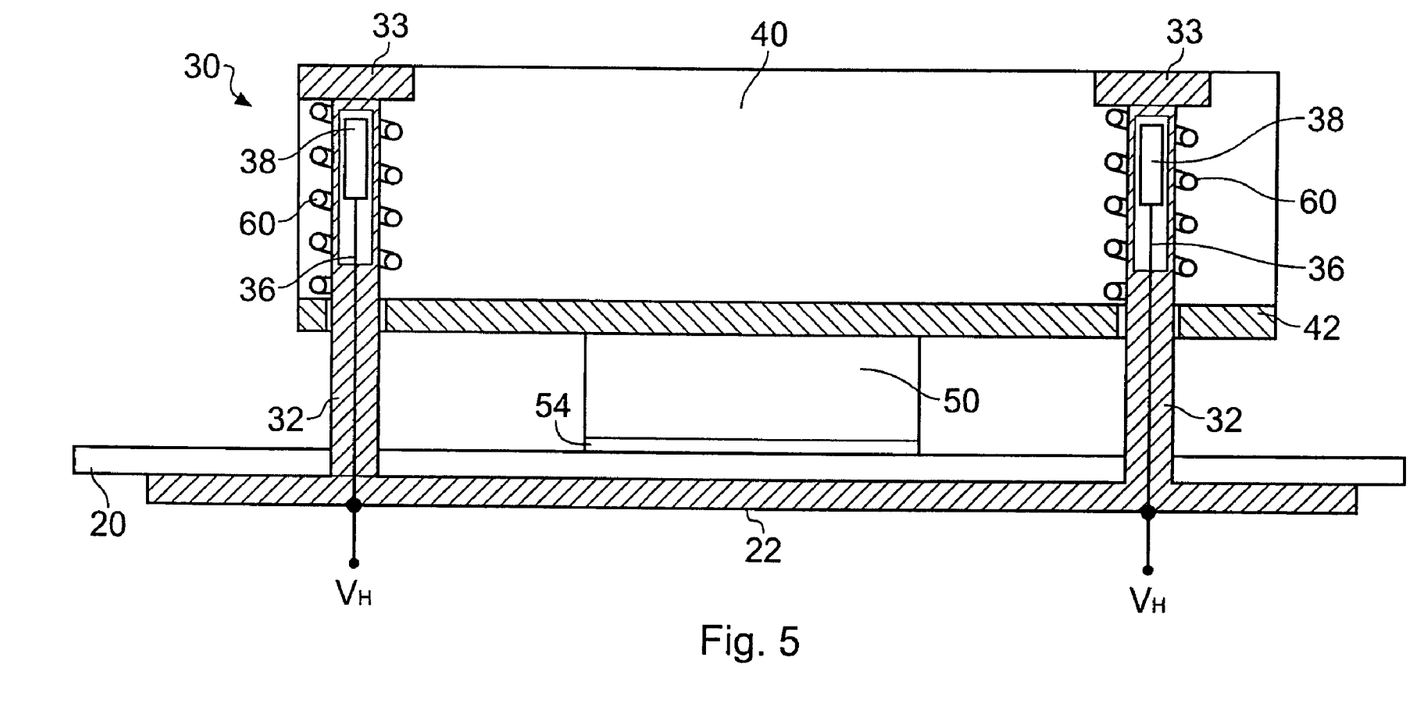
FIG. 5 shows a further example of an electronic component and an assembly mounted on a circuit board.

A further example of an assembly 30 is shown in FIG. 5. In this example, the assembly 30 includes a base portion 42, a number of struts 32 and a number of springs 60 as described above. To provide for heating of the memory metal of the springs 60, a number of heating elements 38 are provided. These heating elements can be provided, for example, within the struts 32 as is shown in FIG. 5. However, the heating elements can be provided elsewhere, for instance, they may be located adjacent the struts 32.

In this example, each strut 32 is provided with a circuit 36 for providing power to the heating elements 38. By applying a voltage $V_h$ across each heating element 38 the temperature of the memory metal in the springs 60 can be adjusted. Accordingly, by choosing an appropriate value of the applied voltage $V_h$, the memory metal of the springs can be raised to a temperature $T_c$, so as to cause expansion of the springs 60.

Other ways of providing heating for the springs 60 are envisaged. For example, the struts 32 may themselves act as heating elements whereby passing a sufficient current through the struts 32 can produce sufficient joule heating for the memory metal for the springs 60 to be heated to a temperature above $T_c$.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed:

1. An assembly for a computer system, the assembly being mountable on a circuit board of the computer system and comprising:
   a base portion for engaging with an electronic component mounted on the circuit board;
   a spring formed of memory metal, the spring being operable to urge the base portion against the electronic component to urge the electronic component towards the circuit board, wherein the spring is configured to provide a greater spring force for urging the base portion against the electronic component when the spring is above a predetermined temperature than when it is below said predetermined temperatures,
   a strut mountable to the circuit board, the strut comprising an electrically conductive portion extending over at least part of the length of the strut; one end of the spring being coupled to strut, the spring being disposed around the strut; and
   a circuit configured to pass a current through the electrically conductive portion of the strut for heating the spring above the predetermined temperature.

2. The assembly of claim 1, comprising one or more formations for emitting heat.

3. The assembly of claim 2, wherein the formations for emitting heat are integrally formed with the base portion.

4. The assembly of claim 1, comprising a plurality of struts and a plurality of said springs, wherein each of the plurality of said springs is disposed around one of the struts.

5. The assembly of claim 1, wherein the spring is a coil spring.

6. The assembly of claim 1, wherein the predetermined temperature is lower than an operating temperature of the computer system.

7. The assembly of claim 1, wherein the predetermined temperature is chosen to be a temperature in the range 0–25 degrees Centigrade.

8. The assembly of claim 1, further comprising a heating element within the strut for heating the spring above the predetermined temperature, wherein the heating element is electrically coupled to the electrically conductive portion of the strut.

9. The assembly of claim 1, wherein the electrically conductive portion of the strut is electrically coupled to the spring, wherein the circuit is configured to pass a current through the spring, wherein the spring is configured to produce Joule heating when the current is passed through the spring to heat the spring above the predetermined temperature.

10. The assembly of claim 1, wherein the memory metal is a nickel titanium alloy.

11. The assembly of claim 1, wherein at least part of the base portion is electrically conductive, wherein the spring is electrically coupled between the base portion and a top portion of the strut, wherein the circuit is configured to pass a current through the strut, the spring, and the base portion, wherein the spring is configured to produce Joule heating when the current is passed through the spring to heat the spring above the predetermined temperature.

12. The assembly of claim 11, wherein the spring is a coil spring disposed around the strut, wherein an outer surface of the strut comprises an electrically isolating material to insulate a portion of the spring from contact with the electrically conductive portion of the strut.

13. The assembly of claim 11, wherein the base portion comprises: an aperture through which the strut passes; and an insulating region within the aperture to electrically isolate the base portion from contact with the electrically conductive portion of the strut.

14. The assembly of claim 1, wherein the assembly comprises a plurality of struts and a plurality of springs, wherein the circuit is configured to apply a different voltage to at least two of the struts.

15. A circuit board having an electronic component mounted thereon and an assembly comprising:
   a base portion for engaging with the electronic component; and
   a spring formed of memory metal, the spring being operable to urge the base portion against the electronic component to urge the electronic component towards the circuit board, wherein the spring is configured to provide a greater spring force for urging the base portion against the electronic component when the spring is above a predetermined temperature than when it below said predetermined temperature;
   a strut mounted to the circuit board comprising an electrically conductive portion extending over at least part of the length of the strut; one end of the spring being coupled to strut, the spring being disposed around the strut; and
   a circuit configured to pass a current through the electrically conductive portion of the strut for heating the spring above the predetermined temperature.

16. The circuit board of claim 15, wherein the assembly comprises one or more formations for emitting heat.

17. The circuit board of claim 16, wherein the formations for emitting heat are integrally formed with the base portion.

18. The circuit board of claim 15, wherein the assembly comprises a plurality of struts and a plurality of said springs, wherein each of the plurality of said springs is disposed around one of the struts.

19. The circuit board of claim 15, wherein the spring is a coil spring.

20. The circuit board of claim 15, wherein the predetermined temperature is selected to be lower than an operating temperature of a computer system.

21. The circuit board of claim 15, wherein the predetermined temperature is chosen to be a temperature in the range 0–25 degrees Centigrade.

22. The circuit board of claim 15, wherein the assembly further comprises a heating element within the strut for heating the spring above the predetermined temperature, wherein the heating element is electrically coupled to the electrically conductive portion of the strut.

23. The circuit board of claim 15, wherein the electrically conductive portion of the strut is electrically coupled to the spring, wherein the circuit is configured to pass current through the spring, wherein the spring is configured to produce Joule heating when the current is passed through the spring to heat the spring above the predetermined temperature.

24. The circuit board of claim 15, wherein the memory metal is a nickel titanium alloy.

25. A computer system comprising a circuit board having an electronic component mounted thereon and an assembly comprising:
   a base portion for engaging with the electronic component; and a spring formed of memory metal, the spring being operable to urge the base portion against the electronic component to urge the electronic component towards the circuit board, wherein the spring is configured to provide a greater spring force for urging the base portion against the electronic component when the spring is above a predetermined temperature than when it below said predetermined temperature;

a strut mounted to the circuit board comprising an electrically conductive portion extending over at least part of the length of the strut; one end of the spring being coupled to strut, the spring being disposed around the strut; and a circuit configured to pass a current through the electrically conductive portion of the strut for heating the spring above the predetermined temperature.

26. The computer system of claim 25, wherein the predetermined temperature is lower than an operating temperature of the computer system.

27. The computer system of claim 25, wherein the assembly comprises a heating element within the strut for heating the spring above the predetermined temperature, wherein the heating element is electrically coupled to the electrically conductive portion of the strut.

28. The computer system of claim 25, wherein the electrically conductive portion of the strut is electrically coupled to the spring, wherein the circuit is configured to pass a current through the spring, wherein the spring is configured to produce Joule heating when the current is passed through the spring to heat the spring above the predetermined temperature.

29. A method comprising:
 providing an assembly comprising:
  a base portion for engaging with an electronic component mounted on a circuit board of a computer system; and
  a spring formed of memory metal, the spring being operable to urge the base portion against the electronic component to urge the electronic component towards the circuit board, wherein the spring is configured to provide a greater spring force for urging the base portion against the electronic component when the spring is above a predetermined temperature than when it below said predetermined temperature; and
  a strut mountable to the circuit board, the strut comprising an electrically conductive portion extending over at least part of the length of the strut; one end of the spring being coupled to strut, the spring being disposed around the strut;
 mounting the assembly on the circuit board; and
 passing a current through the electrically conductive portion of the strut to heat the spring above the predetermined temperature.

30. The method of claim 29, comprising cooling the spring to a temperature below the predetermined temperature prior to mounting the assembly on the circuit board.

31. The method of claim 30, comprising using an aerosol spray to cool the spring below the predetermined temperature.

32. The method of claim 29, comprising using a heating element within the strut to heat the spring to a temperature above the predetermined temperature.

33. The method of claim 29, wherein the spring is configured to produce Joule heating when the current is passed through the spring to heat the spring, the method further comprising passing a current through the spring to heat the spring to a temperature above the predetermined temperature.

34. The method of claim 29, wherein passing a current through the electrically conductive portion of the strut comprises applying a voltage across the strut.

35. The method of claim 29, wherein the assembly comprises a plurality of struts and a plurality of springs, wherein the method further comprises applying a different voltage to at least two of the struts.

* * * * *